United States Patent
Lai et al.

(10) Patent No.: US 10,772,199 B2
(45) Date of Patent: *Sep. 8, 2020

(54) LOW TRANSMISSION LOSS COPPER FOIL AND METHODS FOR MANUFACTURING THE COPPER FOIL

(71) Applicant: Chang Chun Petrochemical Co., Ltd, Taipei (TW)

(72) Inventors: Chien-Ming Lai, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,284

(22) Filed: Dec. 16, 2019

(65) Prior Publication Data

US 2020/0253047 A1   Aug. 6, 2020

Related U.S. Application Data

(60) Provisional application No. 62/800,263, filed on Feb. 1, 2019.

(51) Int. Cl.
*B21C 37/00* (2006.01)
*H05K 1/09* (2006.01)
(Continued)

(52) U.S. Cl.
CPC ............ *H05K 1/09* (2013.01); *B32B 15/01* (2013.01); *B32B 15/08* (2013.01); *B32B 15/20* (2013.01); *C25D 1/04* (2013.01); *C25D 3/12* (2013.01); *C25D 3/22* (2013.01); *C25D 3/38* (2013.01); *C25D 5/10* (2013.01); *B32B 2255/06* (2013.01); *B32B 2255/205* (2013.01); *B32B 2307/202* (2013.01); *B32B 2457/08* (2013.01);
(Continued)

(58) Field of Classification Search
None
See application file for complete search history.

(56) References Cited

U.S. PATENT DOCUMENTS 9,899,683 B2   2/2018   Lee et al.
10,205,170 B1   2/2019   Huang et al.
(Continued)

FOREIGN PATENT DOCUMENTS

CN   2752274 Y   1/2006
CN   1995469 A   7/2007
(Continued)

OTHER PUBLICATIONS

Office Action for TW109101362 dated Mar. 18, 2020.
(Continued)

*Primary Examiner* — Seth Dumbris
(74) *Attorney, Agent, or Firm* — Nixon & Peabody LLP; Thomas P. Pavelko

(57) ABSTRACT

Surface-treated copper foils that exhibit a material volume (Vm) less than 1.90 $\mu m^3/\mu m^2$. Where the surface-treated copper foil is treated on the drum side and includes a treatment layer comprising a nodule layer. Such surface-treated copper foils can be used as a conductive material having low transmission loss, for example in circuit boards.

20 Claims, 1 Drawing Sheet

(51) Int. Cl.
  *C25D 1/04* (2006.01)
  *C25D 3/38* (2006.01)
  *B32B 15/01* (2006.01)
  *C25D 5/10* (2006.01)
  *C25D 3/12* (2006.01)
  *B32B 15/20* (2006.01)
  *B32B 15/08* (2006.01)
  *C25D 3/22* (2006.01)

(52) U.S. Cl.
  CPC .............. *H05K 2201/0355* (2013.01); *Y10T 428/12431* (2015.01)

(56) References Cited

U.S. PATENT DOCUMENTS

| | | | |
|---|---|---|---|
| 10,424,793 | B2 | 9/2019 | Cheng et al. |
| 2004/0029006 | A1 | 2/2004 | Otsuka et al. |
| 2006/0210823 | A1 | 9/2006 | Sano et al. |
| 2008/0280159 | A1* | 11/2008 | Iwakiri ............. C25D 7/06 428/687 |
| 2011/0127074 | A1* | 6/2011 | Takahashi ........... C25D 3/38 174/257 |
| 2012/0111733 | A1 | 5/2012 | Tsai et al. |
| 2013/0011690 | A1* | 1/2013 | Arai ................ C25D 5/16 428/548 |
| 2013/0040162 | A1 | 2/2013 | Fujisawa et al. |
| 2014/0264417 | A1 | 9/2014 | Kobayashi et al. |
| 2016/0264417 | A1 | 9/2016 | Bouillon et al. |
| 2017/0320247 | A1 | 11/2017 | Aizawa et al. |
| 2018/0245230 | A1 | 8/2018 | Sonoda et al. |
| 2018/0279482 | A1 | 9/2018 | Ishii et al. |
| 2018/0282890 | A1 | 10/2018 | Chun et al. |
| 2019/0245014 | A1 | 8/2019 | Park et al. |
| 2019/0249322 | A1 | 8/2019 | Lee et al. |

FOREIGN PATENT DOCUMENTS

| | | |
|---|---|---|
| CN | 101098005 A | 1/2008 |
| CN | 101669237 A | 3/2010 |
| CN | 102418129 A | 4/2012 |
| CN | 102965698 A | 3/2013 |
| CN | 103911633 A | 7/2014 |
| CN | 104781973 A | 7/2015 |
| CN | 104812945 A | 7/2015 |
| CN | 104884409 A | 9/2015 |
| CN | 104928726 A | 9/2015 |
| CN | 105814242 A | 7/2016 |
| CN | 105986288 A | 10/2016 |
| CN | 106304615 A | 1/2017 |
| CN | 106455310 A | 2/2017 |
| CN | 106455341 A | 2/2017 |
| CN | 106455342 A | 2/2017 |
| CN | 106953099 A | 7/2017 |
| CN | 108124392 A | 6/2018 |
| CN | 108306022 A | 7/2018 |
| CN | 108345195 A | 7/2018 |
| CN | 108728874 A | 11/2018 |
| CN | 110004467 A | 7/2019 |
| EP | 3067442 A | 9/2016 |
| JP | 2000119892 A | 4/2000 |
| JP | 2001192879 A | 7/2001 |
| JP | 2012136736 A | 7/2012 |
| JP | 2012172198 A | 9/2012 |
| JP | 2016009526 A | 1/2016 |
| JP | 2018028147 A | 2/2018 |
| JP | 2018524772 A | 8/2018 |
| KR | 10-2015-0062230 A | 6/2015 |
| KR | 1020180080512 A | 7/2018 |
| TW | 201219606 A | 5/2012 |
| TW | 417424 B | 12/2013 |
| TW | 201738413 A | 1/2017 |
| TW | 201716594 A | 5/2017 |
| TW | 201726961 A | 8/2017 |
| TW | 201832922 A | 9/2018 |
| TW | 201834303 A | 9/2018 |
| WO | 2018207786 A1 | 11/2008 |
| WO | 2014065431 A1 | 5/2014 |
| WO | 2017051767 A1 | 9/2017 |
| WO | 2018110579 A1 | 6/2018 |

OTHER PUBLICATIONS

International Search Report for PCT/CN2020/072312 dated Mar. 26, 2020.
International Search Report for PCT/CN2020/072300 dated Mar. 24, 2020.
Non-Final Office Action for U.S. Appl. No. 16/694,412, dated Feb. 10, 2020.
Final Office Action for U.S. Appl. No. 16/654,723, dated Apr. 7, 2020.
Gadelmawla et al., "Roughness Parameters", Jan. 14, 2002, Journal of Materials Processing Technology, 123 (Year 2002), pp. 133-145.
Ficker et al., "Surface Roughness and Porosity of Hydrated Cement Pastes", 2011, Acta Polytechnica vol. 51 No. 3 (Year: 2011), pp. 1-14.
U.S. Appl. No. 16/654,723, filed Oct. 16, 2019.
U.S. Appl. No. 16/694,412, filed Nov. 25, 2019.
U.S. Appl. No. 16/715,284, filed Dec. 16, 2019.
Office Action for U.S. Appl. No. 16/654,723, dated Jan. 3, 2020.
Office Action for U.S. Appl. No. 16/694,434, dated Jan. 29, 2020.
Notice of Allowance for U.S. Appl. No. 16/584,157, dated Jan. 15, 2020.
Office Action for U.S. Appl. No. 16/429,921, dated Aug. 23, 2019.
Notice of Allowance for U.S. Appl. No. 16/429,921, dated Dec. 12, 2019.
Huang et al., "Pulsed Deposition of Ultra-Thin Copper Foils", Technical Article, Plating & Surface Finishing, Sep. 2004, pp. 34-38.
Belov et al., "Correlation Between 3D Texture of Steel Substrate and Tin-Coated Surface With Various Coating Masses", Key Engineering Materials, ISSN; 1662-9795, vol. 769, 2018, pp. 120-127.
Chinese International Search Report (Application No. PCT/CN2020/072158) dated Apr. 8, 2020.
Chinese International Search Report (Application No. PCT/CN2020/072157) dated Apr. 22, 2020.
TW Notice of Allowance for Application No. 109101364 dated May 25, 2020.
TW Notice of Allowance for Application No. 109101373 dated Jun. 15, 2020.
European Search Report for Application No. 20152064.0 dated Jun. 5, 2020.
International Search Report for Application No. PCT/CN2020/072282 dated Apr. 15, 2020.
International Search Report for Application No. PCT/CN2020/072305 dated Apr. 13, 2020.

* cited by examiner

LOW TRANSMISSION LOSS COPPER FOIL AND METHODS FOR MANUFACTURING THE COPPER FOIL

CROSS REFERENCE TO RELATED APPLICATIONS

This application claims the benefit under 35 U.S. C. § 119(e) of U.S. Provisional Application No. 62/800,263 filed Feb. 1, 2019, the contents of which are incorporated herein by reference in their entirety.

FIELD OF THE INVENTION

The present disclosure relates to electrodeposited copper foils having controlled surface properties. The disclosure also relates to circuit boards and the like which exhibit low transmission loss of electrical signals and which incorporate the electrodeposited copper foils as a component thereof.

BACKGROUND

The increasing demands for transmitting massive data requires ever increasing signal transmission speeds between components on circuit boards. To achieve these speeds, frequency ranges are necessarily increasing from below 1 MHz to, 1 GHz, 10 GHz or even higher. In these higher ranges, the currents flow mostly near the surface of the conductor due to the well-known "skin effect" which is the tendency of high frequency current density to be highest at the surface of a conductor and to decay exponentially towards the center. The skin depth, where approximately 67% of the signal is carried, is inversely proportional to the square root of the frequency. Accordingly, at 1 MHz the skin depth is 65.2 µm, at 1 GHz it is 2.1 µm, while at 10 GHz the skin depth is only 0.7 µm. At the higher frequencies, the surface topography or roughness of the conductor becomes ever more important since a roughness on the order of, or greater than, the skin depth will impact the signal transmission through scattering.

An exacerbating factor is that usually the surface of the conductor in printed circuit boards is intentionally roughened to enhance adhesion characteristics to the resin layer used in the laminated structures of circuit boards. A surface roughness, Rz, on the roughened surface on the order of several m is typical and will impact any transmission in the GHz range. The design is therefore constrained by the conflicting need for high roughness to ensure enough adhesion, and low roughness to minimize transmission loss.

One approach to try and provide control of the surface topography is to roughen either the deposited side or the drum side of an electrodeposited copper foil. The deposited side is typically rougher than the drum or "shiny" side. In a normal treated foil, the deposited side is roughened and adhesion to the resin layer is superior since the roughness is typically higher. In order to maintain the quality of signal transmission, reverse treated foil (RTF) has been developed. RTF is roughened at its shiny side, so that roughness is higher than without any roughening but can be controlled to be lower than where roughening is provided on the deposited side. Therefore, RTF provides good adhesion, for example comparable to normal treated foil or at least acceptable for applications such as for use in circuit boards. RTF also ideally has reduced transmission loss of signal when compared to normal treated foil.

Although RTF technologies can provide an improvement with regards to transmission loss, it is not always clear what surface properties of a copper foil provide an acceptable improvement. Although Rz is one parameter that can be used, in some cases this property is not predictive enough. There therefore remains a need for copper foils with low transmission loss for the manufacturing of circuit boards and copper foils with controlled properties to achieve the desired low transmission loss.

SUMMARY

In general, the disclosure herein relates to a copper foil such as electrodeposited copper foils that can be used as a conductor in a circuit board. Copper foils have been prepared having controlled surface properties that provide for low transmission loss even at high frequencies.

In a first aspect, the disclosure provides a surface-treated copper foil comprising an electrodeposited copper foil including a drum side and a deposited side, and a treatment layer disposed on the drum side providing a surface-treated side wherein the treatment layer comprises a nodule layer. The surface-treated side exhibits a material volume (Vm) that is less than 1.90 µm$^3$/µm$^2$. Optionally, the surface-treated side exhibits a Vm in a range of 0.11 to 1.86 µm$^3$/µm$^2$, such as in a range of 0.25 to 0.85 µm$^3$/µm$^2$. Optionally, the nodule layer comprises copper nodules. Optionally, after the surface-treated copper foil is subjected to heating at 200° C. for 1 hour, the surface-treated copper foil exhibits a tensile strength in a range of 21.3 to 45.1 kg/mm$^2$.

In some options, the surface-treated copper foil has an oxygen content equal to or less than 468 ppm, such as optionally less than 348 ppm. Optionally, the surface-treated copper foil has an oxygen content in a range of 53 to 348 ppm. Optionally, the surface-treated side exhibits a material volume (Vm) in a range of 0.25 to 1.90 µm$^3$/µm$^2$ and the surface-treated copper foil has an oxygen content equal to or less than 468 ppm.

In some other options, the surface-treated copper foil has a hydrogen content equal to or less than 29 ppm. Optionally, the surface-treated copper foil has a hydrogen content in a range of 5 to 29 ppm.

Optionally, the treatment layer further comprises at least one of a cover layer, a barrier layer, an anti-tarnish layer, and a coupling layer. Optionally, the cover layer comprises copper. Optionally, the barrier layer comprises a metal or an alloy containing at least one of metal, and the metal is selected from Ni, Zn, Cr, Co, Mo, Fe, Sn, and V. Optionally, the barrier layer comprises two or more layers, each layer independently comprising a metal or an alloy containing at least one of metal, and the metal is selected from Ni, Zn, Cr, Co, Mo, Fe, Sn, and V. Optionally, the anti-tarnish layer comprises chromium. Optionally, the coupling layer includes silicon.

In a second aspect, the disclosure provides a laminate comprising a surface-treated copper foil and a resin layer in contact with a surface-treated side of the surface-treated copper foil. The surface-treated copper foil comprises an electrodeposited copper foil including a drum side and a deposited side, a treatment layer disposed on the drum side providing the surface-treated side, and wherein the treatment layer comprises a nodule layer. The surface-treated side also exhibits a material volume (Vm) in a range of 0.11 to 1.86 µm$^3$/µm$^2$. The surface-treated copper foil has an oxygen content equal to or less than 468 ppm, a hydrogen content equal to or less than 29 ppm, and after the surface-treated copper foil is subjected to heating at 200° C. for 1 hour, the surface-treated copper foil exhibits a tensile strength in a range of 21.3 to 45.1 kg/mm².

In a third aspect, the disclosure provides a circuit board comprising the surface-treated copper foil according to the first aspect, and a plurality of components mounted on the circuit board. At least a first component and a second component of the plurality of components are electrically connected to each other through the surface-treated copper foil of the circuit board.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
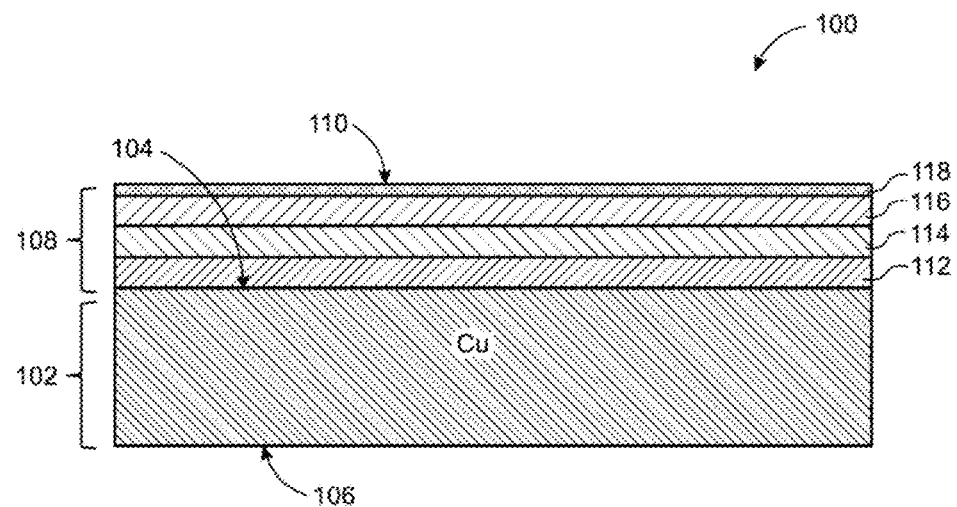
FIG. 1 shows a surface-treated copper foil according to some embodiments.

The present disclosure is susceptible to various modifications and alternative forms. Some representative embodiments have been shown by way of example in the drawings and will be described in detail herein. It should be understood, however, that the inventions are not intended to be limited to the particular forms disclosed. Rather, the disclosure is to cover all modifications, equivalents, and alternatives falling within the spirit and scope of the inventions as defined by the appended claims.

DETAILED DESCRIPTION

Surface-treated copper foils are described that exhibit low transmission loss. The surface-treated copper foils have controlled surface characteristics such as material volumes. Such surface-treated copper foil can be useful for the production of articles needing low transmission loss of electrical signals, such as printed circuit boards or any thin copper foil covering an insulator.

FIG. 1 shows a schematic cross-sectional view of an embodiment of a surface-treated copper foil 100, which includes an electrodeposited copper foil 102 and a treatment layer 108. The electrodeposited copper foil 102 has a drum side 104 and a deposited side 106. The treatment layer 108 is disposed on the drum side 104 and provides a surface-treated side 110.

As used herein the "drum side" or "shiny side" of the electrodeposited copper foil is the surface of the electrodeposited copper foil that is in contact with a cathode drum used during the electrodeposition, while the "deposited side" is the opposite side to the drum side, or the surface of the electrodeposited copper foil that is in contact with an electrolyte solution during the electrodeposition forming the electrodeposited copper foil. These terms relate to a manufacturing process for producing electrodeposited copper foils which include partially immersing the rotating cathode drum assembly into the electrolyte solution containing copper ions. Therefore, under operation of an electric current, copper ions are drawn to the cathode drum and reduced, resulting in copper metal plating onto the surface of the cathode drum forming an electrodeposited copper foil on the surface of the cathode drum. This electrodeposited copper foil is formed and removed from the cathode drum in a continuous process by rotating the cathode drum and removing the electrodeposited copper foil as the formed copper foil rotates with the cathode drum out of the electrolyte solution. For example, the electrodeposited copper foil can be pulled off the cathode drum as it is formed by, and passed over or through rollers in a continuous process.

The electrodeposited copper foil 102 can be further treated on its drum side 104 with a surface treatment, forming a treatment layer. As shown in FIG. 1, the deposited side 104 is covered with a treatment layer 108, providing a surface-treated side 110, which is the exterior surface of the treatment layer 108. The surface treatment can include one or more treatments such as a roughening treatment to provide a nodule layer 112, a passivation treatment to provide a barrier layer 114, an anti-tarnishing treatment to provide an anti-tarnish layer 116, and a coupling treatment to provide a coupling layer 118. Therefore, in the embodiment shown in FIG. 1, the nodule layer 112, barrier layer 114, anti-tarnish layer 116, and coupling layer 118 are sub-layers of the treatment layer 108. The surface treatment and specific sub-layers of treatment layer 108 shown in the figure are an embodiment, and other surface treatments and other sub-layers in addition to or as alternatives thereof can be used in some other embodiments. Accordingly, one or more than one of the sub-layers may be present in the different embodiments of the treatment layer 108.

By controlling the surface properties of the surface-treated side 110, low transmission loss at high frequencies can be achieved. For example, the surface property of material volume (Vm) can be controlled so that circuit boards having good transmission properties can be made.

Figure 2:
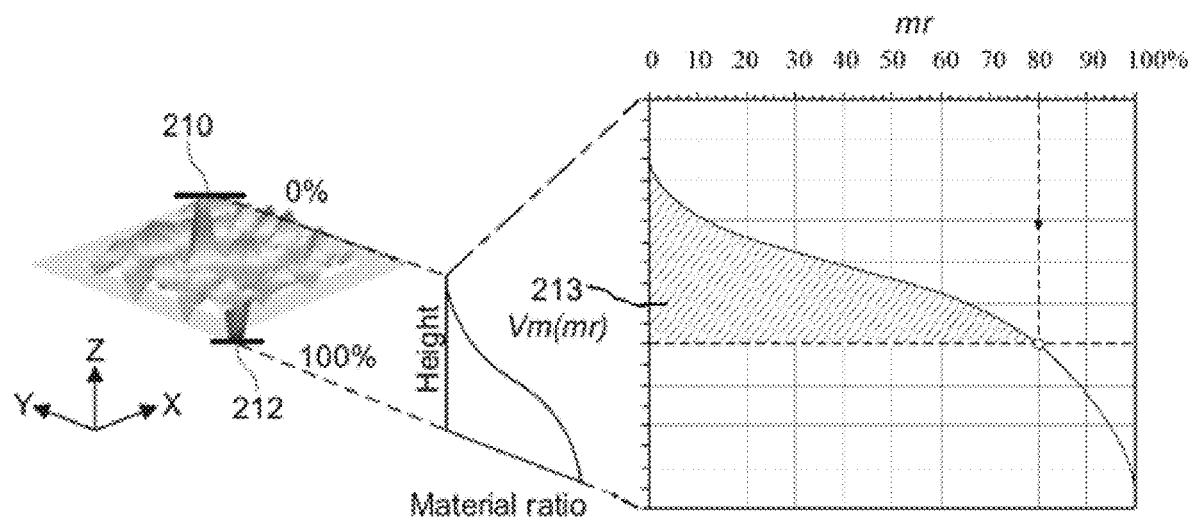
FIG. 2 shows a 3D surface plot and an areal material ratio plot.

The volume parameters as defined herein are illustrated with reference to FIG. 2, which shows a 3D surface and the derivation of the areal material plot for obtaining volume parameters. FIG. 2, left side, is a three-dimensional graphic representation of the surface geometry of a surface, such as a drum side or a deposited side of an electrodeposited copper foil. FIG. 2, right side shows the derivation of an areal material ratio curve as can be obtained by using the ISO Standard Method ISO 25178-2:2012, which spans a material ratio (mr) of 0%, at the top of the highest peak 210, to the lowest valley 212 at which the mr is 100%.

The material volume (Vm) can be described as the volume of peaks existing on the surface and is quantified by integrating the volume of the material enclosed below the surface and above a horizontal cutting plane set at a height corresponding to a material ratio (mr) between 0% (the top of the peak 210) and 100% (the bottom of the valley 212). The material volume (Vm) is maximum where the material ratio is 100%, and the material volume (Vm) is a zero where the material ratio is 0%. For example, the Vm at a material ratio (mr) of 80% is shown as the shaded area 213 on the plot of FIG. 2. As used herein, the Vm's listed are the Vm at a material ratio (mr) of 80% unless otherwise noted.

In some embodiments, the surface-treated copper foil 100 has a Vm on the surface-treated side 110, in a controlled range between a low and a high value, such as between a low value of about 0 $\mu m^3/\mu m^2$ and a high value of about 1.90 $\mu m^3/\mu m^2$. It is to be expressly understood that the ranges are continuous and can be represented by any value in this range. In some embodiments, Vm has a low value of at least 0, 0.10, 0.11, 0.15, 0.20, 0.25, 0.27, 0.30, 0.45, 0.47, 0.48, 0.50, 0.60, 0.70, 0.75, 0.78, 0.80, 0.81, 0.82, 0.83, 0.90, 1.00, 1.10, 1.20, 1.30, 1.40, 1.41, 1.50, 1.60, 1.62, 1.65, 1.70, 1.80, 1.85, 1.86, or 1.90 $\mu m^3/\mu m^2$. In some embodiments, Vm has a high value of not more than 1.90, 1.86, 1.85, 1.80, 1.70, 1.65, 1.62, 1.60, 1.50, 1.41, 1.40, 1.30, 1.20, 1.10, 1.00, 0.90, 0.83, 0.82, 0.81, 0.80, 0.78, 0.75, 0.70, 0.60, 0.50, 0.48, 0.47, 0.45, 0.30, 0.27, 0.25, 0.20, 0.15, 0.11 or 0.10 $\mu m^3/\mu m^2$.

Without endorsing any particular mechanism or theory, a low Vm can result in less signal loss at high frequencies due to the skin effect concentration of electric conduction near the surface where the peaks of material can cause more loss.

In some embodiments, other factors, such as the chemical composition and mechanical responses of a copper foil, can be controlled depending on a specific application or use of the copper foil. By controlling the chemical composition and mechanical properties of the surface-treated copper foil, high reliability can be achieved, where reliability refers to how the copper-foil or a part made using the copper foil can withstand environments such as high temperature, high pressure and high humidity. For example, the amounts of hydrogen and oxygen incorporated in the surface-treated copper foil, and the tensile strength of the surface-treated copper foil can be controlled so that circuit boards having high reliability can be made using these surface-treated copper foils.

In some embodiments, the surface-treated copper foil has an oxygen content in a controlled range between a low and a high value, such as between a low value equal to or more than 0 ppm and a high value of equal to or less than 468 ppm. It is to be expressly understood that the ranges are continuous and can be represented by any value in this range. In some embodiments, the oxygen content has a high value not more than 468, 450, 400, 350, 348, 300, 256, 250, 200, 150, 149, 147, 143, 140, 136, 100, 90, 86, 80, 70, 60, 53, or 50 ppm. In some embodiments, the oxygen content has a low value of at least 1, 10, 20, 30, 40, 50, 53, 60, 70, 80, 86, 90, 100, 136, 140, 143, 147, 149, 150, 200, 250, 256, 300, 348, 350, 400, or 450 ppm.

In some embodiments, the surface-treated copper foil has a hydrogen content in a controlled range between a low and a high value, such as between a low value of equal to or more than 0 ppm and a high value less than or equal to 29 ppm. It is to be expressly understood that the ranges are continuous and can be represented by any value in this range, such as 1, 2, 3, 4, 5, 6, 7, 8, 9, 10, 11, 12, 13, 14, 15, 16, 17, 18, 19, 20, 21, 22, 23, 24, 25, 26, 27, 28 or 29 ppm.

As used herein, "tensile strength" relates to the maximum amount of tensile stress a material can be subjected to before it undergoes catastrophic failure, such as breaking into two parts. The tensile strength can be tested, for example, after subjecting the material to a heat treatment, such as heating to 200° C. for one hour and then cooled to ambient temperature. Without being bound to any specific theory, this heat treatment can simulate the heat stress a copper foil undergoes during a lamination process in the preparation of a circuit board. The tensile strength test can then provide an indication of how the strength of the copper foil will be impacted by a lamination process.

As used herein, ambient temperature is understood to be about room temperature or between about 10 to about 40° C., about 15 to 35° C., about 20 to 30° C. or about 23 to about 27° C.

In some embodiments, the surface-treated copper foil, after heating to 200° C. for one hour and then allowed to cool to ambient temperature, has a tensile strength in a controlled range between a low and a high value, such as between a low value equal to or more than 21.3 kg/mm² and a high value of less than or equal to 45.1 kg/mm². It is to be expressly understood that the ranges are continuous and can be represented by any value in this range. In some embodiments, the tensile strength has a low value of at least 21.3, 25.0, 29.0, 29.3, 30.0, 34.0, 34.4, 35.0, 35.5, 36.0, 36.7, 40.0, 40.7, or 45.0 kg/mm². In some embodiments, the tensile strength has a high value of not more than 45.1, 45.0, 40.7, 40.0, 36.7, 36.0, 35.0, 35.0, 34.4, 34.0, 30.0, 29.3, 29.0, 25.0, or 21.3 kg/mm².

In some embodiments, the nodule layer, such as nodule layer 112, can include metal nodules such as copper nodules. The nodules can be formed, for example, by electroplating the metal onto the copper foil. In some embodiments, the copper nodules can be made of copper or copper alloy. In some embodiments, the nodule layer can have a thickness greater than about 1 μm. In some embodiments, the combined thickness of the barrier layer, anti-tarnish layer, and coupling layer are less than about 0.1 μm. In some embodiments, a cover layer is disposed on the nodule layer, such as a copper deposition on copper nodules. For example, the cover layer can help to prevent exfoliation of the metal nodules.

As used herein, the "barrier layer" is a layer made of a metal or an alloy containing at least one of metal. In some embodiments, the barrier layer, such as barrier layer 114, is made of at least one metal selected from zinc (Zn), chromium (Cr), nickel (Ni), cobalt (Co), molybdenum (Mo), vanadium (V), iron (Fe), tin (Sn), and combinations thereof. In some embodiments, the barrier layer comprises Ni. In some embodiments, the barrier layer comprises Zn. In some embodiments, the barrier layer comprises a Ni layer and a Zn layer.

As used herein, an "anti-tarnish layer", such as anti-tarnish layer 116, is a coating applied to a metal that can protect the coated metal from degradation such as due to corrosion. In some embodiments, the anti-tarnish layer comprises a metal or an organic compound. For example, chromium or chromium alloys can be used as the metal coating on the electrodeposited copper foil. When the anti-tarnish layer is made of chromium alloy, it further contains any one or more of zinc (Zn), nickel (Ni), cobalt (Co), molybdenum (Mo), and vanadium (V). In some embodiments where the anti-tarnish layer is made of organics, the layer may comprise at least one member selected from the group consisting of triazoles, thiazoles, and imidazoles, or their derivatives. The triazole group includes but is not limited to orthotriazole (1,2,3-triazole), benzotriazole, tolyltriazole, carboxybenzotriazole, chlorine substituted benzotriazole, 3-amino-1,2,4-triazole, 2-amino-1,3,4-triazole, 4-amino-1,2,4-triazole, 1-amino-1,3,4-triazole, and isomers thereof, or derivatives thereof. The thiazole group includes but not limited to thiazole, 2-mercaptobenzothiazole, dibenzothiazyldisulfide, and isomers thereof, or derivatives thereof. The imidazole group includes but not limits to imidazole, 2-methylimidazole, 2-ethyl-4-methylimidazole, 2-phenylimidazole, 1-benzyl-2-methylimidazole, and isomers thereof, or derivatives thereof.

As used herein, the "coupling layer", such as coupling layer 118, is a layer that is added to improve the binding between the copper foil and a resin layer, for example a resin layer used in the manufacture of circuit boards. In some embodiments, this is provided by a silane treatment which provides a layer including silicon and oxygen. The silane can be exemplified but not limited to amino-based silane, epoxy-based silane, and mercapto-based silane. The silane may be selected from vinyltrimethoxysilane, vinyltriethoxysilane, 2-(3,4-epoxycyclohexyl)ethyltrimethoxysilane, 3-glycidoxypropyl methyl dimethoxysilane, 3-glycidoxypropyl trimethoxysilane, 3-glycidoxypropyl methyldiethoxysilane, 3-glycidoxypropyl triethoxysilane, p-styryltrimethoxysilane, 3-methacryloxypropyl methyldimethoxysilane, 3-methacryloxypropyl trimethoxysilane, 3-methacryloxypropyl methyldiethoxysilane, 3-methacryloxypropyl triethoxysilane, 3-acryloxypropyl trimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, partially hydrolyzates of 3-triethoxysilyl-N-(1,3-dimethyl-butylidene)propylamine, N-(vinylbenzyl)-2-aminoethyl-3-aminopropyltrimethoxysilane hydrochloride, N-phenyl-3-aminopropyltrimethoxysilane, N-(vinylbenzyl)-2-aminoethyl-3-aminopropyltrimethoxysilane hydrochloride, tris-(trimethoxysilylpropyl) isocyanurate, 3-ureidopropyltrialkoxysilane, 3-mercaptopropylmethyldimethoxysilane, 3-mercaptopropyltrimethoxysilane, and 3-isocyanatepropyltriethoxysilane, but not limited thereof.

In some embodiments, the sub-layers, such as the sub-layers of treatment layer 108, are provided so that the nodule layer 112 covered with the barrier layer 114 is disposed on the drum side 104 of the electrodeposited copper foil, the barrier layer 114 is covered with the anti-tarnish layer 116 and the anti-tarnish layer 116 is covered with the coupling layer 118; however, according to other embodiments, the stacking order or number of the sub-layers is not limited therein. In the embodiment shown by FIG. 1, the final physical surface of the surface-treated side 110 is therefore provided by the coupling layer 118 which can then be coupled to a resin layer in a laminate structure. In some embodiments, the surface properties of the surface-treated side 110, such as Vm is dominated by the nodule layer 112, since barrier layer 114, anti-tarnish layer 116, and coupling layer 118 in any combination can be much thinner than the nodule layer 112.

In some embodiments, a cover layer is disposed between the nodule layer 112 and barrier layer 114. In some embodiments, the barrier layer 114 comprises sub-layers including a nickel layer, and a zinc layer over the nickel layer.

In some embodiments, the deposited side 106 of the electrodeposited copper foil includes a barrier layer and an anti-tarnish layer. For example, a zinc layer on the deposited side 106 and then a chromium layer deposited on the zinc layer.

In some embodiments, the surface-treated copper foil such as 100 and a resin layer are combined to form a laminated structure. The structure can include two or more layers of alternating copper foil and resin layer. These can be formed, for example, by stacking alternate sheets of the copper foil, at least one being a surface-treated copper foils 100, and a resin layer, and compressing the stack together using a press while heating the stack. In some embodiments, the resin layer is contacted with the surface-treated side 110 of the surface-treated copper foil 100. Where more than three conductive layers, e.g., at least one being a surface-treated copper foil 100, are alternated with resin layers, the laminate is a multilayer structure such as can be used to make a multilayer printed circuit board (PCB). In these embodiments, the surface-treated copper foil can optionally include a barrier layer and anti-tarnish layer on the deposited side 106.

As used herein, a "resin" relates to an organic polymeric material that can be formed as a sheet or layer on a substrate such as a surface-treated copper foil. Some examples of a resin include phenolic resins, epoxy resins, polyester resins (e.g., polyethylene terephthalates), polyimide resins, acrylics, formaldehyde resins, bismaleimide triazine resins, cyanate ester resin, fluoropolymers, poly ether sulphone, cellulosic thermoplastics, polycarbonate, polyolefins, polypropylene, polysulfide and polyurethane. The resins can also include filler materials or reinforcing materials such as aramide, carbon, glass, cellulosic and inorganic materials, all of these optionally in the form of particles, fibers, chopped fibers, woven materials or a webbing. In some embodiments, the resin is formed into a sheet using one or more of the resins and one or more of the filler materials in a composite sheet. In some embodiments, one or more resin layers are stacked on top of each other and in direct contact to provide a multi-stack resin layer sometimes referred to a multiple board. As used herein, a resin layer can refer to a multi-stack resin layer such as a multiple board.

In some embodiments, the surface-treated copper foil 100, optionally including a barrier layer and an anti-tarnish layer on the deposited side 106, is used to produce a circuit board (e.g., a printed circuit board or PCB). For example, a circuit board formed using a laminate of the copper foil and a resin layer. Further processing such as the production of conducting lines or tracks, contact pads, shielding areas, and conduction vias can be achieved by known processing methods such as lithography, copper etching, and drilling of the copper foil/resin laminate. Components, such as batteries, resistors, LEDs, relays, transistors, capacitors, inductors, diodes, switches, microcontrollers, crystals and oscillators, and integrated circuit can be mounted (e.g., mechanically and electrically connected) to the circuit board by known methods. For example, surface mount methods or the through-hole methods can be used to attach the components, and pick and place technologies can be used for assembly.

In some embodiments, the surface-treated copper foil 100, optionally including a barrier layer and an anti-corrosion layer on the deposited side 106, can be used for making a circuit board, including a plurality of components mounted on the circuit board, that is used in a device. As used herein, a device comprises any item or component for processing an electric signal such as by manipulation of the voltage, current, frequency or power of the signal. For example, and without limitation, a computer such as used in a laptop, desktop, vehicles, phones, measurement and monitoring devices (e.g., glucose meter, pH meter, air monitoring device), data output devices (e.g., monitors, printers), input devices (touch screens, keyboards, mouse), and wireless transmission/receiving devices such as Wi-Fi, Zigbee and Bluetooth.

In some embodiments, the surface-treated copper foil 100, optionally including a barrier layer and an anti-corrosion layer on the deposited side 106, can be used as a current collector. In some embodiments, the surface-treated copper foil can be used as a current collector in a lithium ion secondary battery. For example, in a laminated type lithium ion battery or coin type lithium ion battery.

It should be understood within the scope of the present disclosure, the above-mentioned technical features and technical features mentioned below (such as examples) can be combined freely and mutually to form new or preferred technical solutions, which are omitted for brevity.

EXAMPLES

General Copper Foil Preparation

The system for manufacturing the electrodeposited copper foil includes a metal cathode drum and an insoluble metal anode. The metal cathode drum is rotatable. In this system, the insoluble metal anode is arranged at approximately the lower half of the metal cathode drum and surrounds the metal cathode drum. The electrodeposited copper foil is manufactured using continuous electrodeposition by flowing the copper sulfate electrolyte solution between the metal cathode drum and the insoluble metal anode, applying an electrical current between these to allow copper ions to be drawn to the metal cathode drum and reduced causing electrodeposited copper on the metal cathode drum forming the electrodeposited copper foil, and detaching the electrodeposited copper foil from the metal cathode drum when a predetermined thickness is obtained.

The flowing of copper sulfate electrolyte is supplied by a pipe. The pipe is arranged between a gap in the insoluble metal anode, and its lengthwise direction is parallel to the axial direction of the cathode drum. The pipe includes several openings along its length so that the copper sulfate electrolyte can be dispersed approximately evenly along the length of the cathode drum. The distance of the pipe to the insoluble anode can be controlled. As listed in the Table 1, the distance from the center of the pipe to the insoluble anode is varied between 15 and 25 mm.

During the electrodeposition, the distance between the cathode drum surface and the insoluble metal anode surface can be controlled. As listed in the Table 1, the shortest distance between these surfaces is varied between 6 mm and 12 mm. The distance between anode and cathode listed in the Table 1 is the distance between the cathode drum and the insoluble metal anode.

Electrodeposited Copper Foil Preparation

Copper wire was dissolved in an aqueous solution of sulfuric acid (50 wt %) to prepare a copper sulfate electrolyte solution which contained 320 g/L of copper sulfate ($CuSO_4.5H_2O$) and 100 g/L of sulfuric acid. Hydrochloric acid (obtained from RCI Labscan Ltd) was added to provide a chloride ion concentration of 20 mg/L in the copper sulfate electrolyte solution. Additionally, 0.35 mg/L of gelatin (DV, Nippi company) was added to the copper sulfate electrolyte solution.

After preparation of the copper sulfate electrolyte solution, electrodeposited copper foil was prepared by electrodeposition. During the electrodeposition, the liquid temperature of the copper sulfate electrolyte solution was maintained at about 50° C., and the current density was maintained at about 70 A/dm². Electrodeposited copper foils having a thickness of about 35 μm were prepared.

Surface Treatment

In a first step for the roughening treatment, after preparing the electrodeposited copper foil as outlined above, the electrodeposited copper foil is cleaned by using an acid solution. An acid washing vessel was used for this procedure where the vessel was filled with a solution containing 130 g/L copper sulfate and 50 g/L sulfuric acid and a temperature of about 27° C. was maintained for the solution. The electrodeposited copper foil was directed into the acid washing vessel where it was soaked into the electrolyte for 30 seconds to remove the oil, fat and oxide on the surface. The electrodeposited copper foil was then rinsed with water.

The nodule layer was then formed by electroplating on the surface of the drum side of the electrodeposited copper foil. For plating the nodule layer, a copper sulfate solution was used as the electrolyte solution which contained 70 g/L of copper sulfate and 100 g/L of sulfuric acid. The electrolyte solution also contained $Na_2MoO_4$ varied in a range between 50 and 400 mg/L, $SnSO_4$ varied in a range between 1000 and 5000 mg/L and 10 mg/L of Saccharin (1,1-dioxo-1,2-benzothiazol-3-one, manufactured by Sigma-Aldrich Company); as listed in the Table 1. The temperature of the electrolyte solution was maintained at about 25° C., and the electrodeposited copper foil was electroplated for 10 seconds at a current density of 10 A/dm². This roughening treatment provides a nodule layer on the drum side.

To prevent exfoliation of the nodule layer, a copper cover layer was deposited onto the nodule layer by electrodeposition. The plating conditions were as follows.
Copper sulfate: 320 g/L
Sulfuric acid: 100 g/L
Liquid temperature: 40° C.
Current density: 15 A/dm²
Plating time: 10 seconds After completing the cover plating process, two barrier layers were applied. Firstly, nickel was deposited on the surface of nodule layer. This serves to passivate the nodule layer. The plating conditions were as follows.
Nickel sulfate: 188 g/L
Boric acid: 32 g/L
Hypophosphorous acid: 0 to 5 g/L
Liquid temperature: 20° C.
pH value: 3.5
Current density: 0.5 to 0.9 A/dm²
Plating time: 3 seconds Secondly, after a water wash, a zinc layer was deposited on the nickel layer and the deposited side of the electrodeposited copper foil simultaneously. The zinc layer provides heat-proofing. The plating conditions were as follows.
Zinc sulfate: 11 g/L
Ammonium vanadate: 0.25 g/L
Liquid temperature: 15° C.
pH value: 13
Current density: 0.3 to 0.7 A/dm²
Plating time: 2 seconds After formation of the barrier layers, washing is conducted with water and a chromium layer was formed on the zinc layer, both on the deposition and drum sides of the electrodeposited copper foil, by electroplating in a plating bath. The plating conditions were as follows.
Chromic acid: 5 g/L
Liquid temperature: 35° C.
pH value: 12.5
Current density: 10 A/dm²
Plating time: 5 seconds Finally, a coupling layer was formed on the chromium layer on the drum side of the electrodeposited copper foil. A silane solution is sprayed on the chromium layer for 10 seconds. The silane solution was a water solution containing 0.25 wt % of 3-aminopropyltriethoxysilane.

After silane treatment, the copper foil is heated at 120° C. for a one-minute residence time in an oven and then wound into a roll.

Test Methods

Volume Parameters

Material volume (Vm) of the copper foil was measured in accordance with ISO 25178-2:2012 by using surface texture analysis of laser microscope. The laser microscope was a LEXT OLS5000-SAF manufactured by Olympus and the images were made at an air temperature of 24±3° C. and a relative humidity of 63±3%.

Settings used for the measurements were as follows: light source was 405 nm-wavelength; objective lenses used were 100× (MPLAPON-100×LEXT); optical zoom was 1.0×; image area was 129 μm×129 μm; resolution was 1024 pixels×1024 pixels; condition was set to auto tilt removal; and the filter was set as unfiltered.

The parameter Vm as listed in the Table 1 is calculated for the material ratios from 0% to 80%, or mr=80%. The unit of material volume is $\mu m^3/\mu m^2$.

Tensile Strength after Heat Treatment

The tensile strength was measured in accordance with IPC-TM-650. A surface-treated copper foil was place in an oven at 200° C. for 1 hour. After cooling to the ambient temperature, the surface-treated copper foil was cut to obtain a test sample having a size of 100 mm×12.7 mm (length× width). The test sample was measured at the ambient temperature (about 25° C.) under the conditions of a chuck distance of 50 mm and a crosshead speed of 50 mm/min by using Model AG-I testing machine of Shimadzu Corporation.

Transmission Loss

The transmission characteristics were evaluated using a strip-line structure. A copper foil was attached on a resin and further made into a strip-line, and this strip-line was used as source electrode. The thickness of the resin (S7439G, manufactured by SyTech Corporation) was 152.4 μm, and had Dk of 3.74 and Df of 0.006 under 10 GHz signal test by IPC-TM 650 No. 2.5.5.5. The strip-line had a length of 100 mm.

After the strip-line was made, two surfaces were covered with two other resins (S7439G, manufactured by SyTech Corporation), respectively, and two other copper foils were disposed on the resins as ground electrode. This assembly was without coverlay film and had a characteristic impedance of about 50Ω. Comparison of the signals transferred by the strip-line and the ground electrode provides the transmission loss.

The measurement of the strip line and ground electrode was done using an Agilent PNA N5230C network analyzer. The frequency range used was 200 MHz to 15 GHz, the sweep number was 6401 point, the calibration was TRL and the test method was the Cisco S3 method.

The evaluation criteria for transmission loss at 8 GHz are as follows.
A: Good where the transmission loss has a value that is greater than −0.75 dB/in, e.g., between −0.75 and 0 dB/in.
B: Moderate where the transmission loss has a value in a range of −0.75 dB/in to −0.8 dB/in.
C: Poor where the transmission loss has a value less than −0.8 dB/in.

Reliability

Pressure cooker test (PCT) is a reliability test to assess the ability of a product to withstand high temperature, high pressure and high humidity conditions. This test is useful to evaluate a resin sealed device, such as a circuit board, for its thermal resistance during solder reflow. And also the moisture resistance can be evaluated by tested in a severe environment. Predictions of crack formation in the resin caused by heating during the reflow step of a circuit board processing can be done by this accelerated test. It also provides a prediction of how the manufactured parts (e.g., circuit boards or pre-fabrication boards for making circuit boards) are expected to perform in storage and transportation.

Reliability was determined as follows. Six pieces of resin sheet having a thickness of 0.076 mm (S7439G, manufactured by SyTech Corporation) were stacked together and a surface-treated copper foil was placed on them, and then placed between two flat stainless steel plates. The resins sheets and surface-treated copper foil were then, hot pressed at a temperature of 200° C. and under a pressure of 400 psi for 120 minutes to provide a laminate.

Pressure cooker test (PCT) was conducted by placing the laminate into an oven at a temperature of 121° C., a pressure of 2 atm, and moisture of 100% RH for 30 minutes. After PCT, a solder bath test was conducted by dipping the laminate at a temperature of 288° C. for 10 seconds. Where a laminate, after the solder bath test, becomes blistered, cracks or delamination occurs, that particular laminate is considered to have failed.

The evaluation criteria for reliability are as follows.
A: Good where the laminate does not fail after the solder bath test is applied to that same laminate more than 50 times.
B: Moderate where the laminate fails after the solder bath test is applied to that same laminate from 10 to 50 times.
C: Poor where the laminate fails after the solder bath test is applied to that same laminated less than 10 times.

Copper Foil Characterization

Copper foils made with specific Vm are listed in Table 1. The data listed exemplify the effect of Vm on the transmission loss performance of surface-treated copper foils. The indicators are A, B and C as indicated above and in the table. Examination of this data illustrates that Vm provides a control of the transmission loss. For example, In experiments 1 to 14, the Vm is less than 1.90 $\mu m^3/\mu m^2$. For these experiments, the transmission loss is rated either A or B. For comparison, in experiments 15 to 17, where Vm is very high, 2.03 to 2.55 $\mu m^3/\mu m^2$, the transmission loss is poor (C).

TABLE 1

Material Void Volume Effect on Transmission Loss

| Experiment | Distance between anode and cathode mm | Distance between pipe to anode mm | Nodulization NaMoO₄ ppm | SnSO₄ ppm | Saccharin ppm | Vm $\mu m^3/\mu m^2$ | 8 GHz transmission loss A = Good B = Moderate C = Poor |
|---|---|---|---|---|---|---|---|
| 1 | 10 | 25 | 200 | 3000 | 10 | 0.78 | A |
| 2 | 8 | 25 | 200 | 3000 | 10 | 0.80 | A |
| 3 | 12 | 25 | 200 | 3000 | 10 | 0.83 | A |
| 4 | 10 | 15 | 200 | 3000 | 10 | 0.81 | A |
| 5 | 10 | 35 | 200 | 3000 | 10 | 0.82 | A |
| 6 | 10 | 25 | 100 | 3000 | 10 | 1.62 | B |
| 7 | 10 | 25 | 300 | 3000 | 10 | 0.27 | A |
| 8 | 10 | 25 | 200 | 2000 | 10 | 1.41 | B |
| 9 | 10 | 25 | 200 | 4000 | 10 | 0.48 | A |
| 10 | 8 | 35 | 100 | 3500 | 10 | 1.86 | B |
| 11 | 6 | 25 | 200 | 3000 | 10 | 0.80 | B |
| 12 | 10 | 45 | 200 | 3000 | 10 | 0.75 | B |

TABLE 1-continued

Material Void Volume Effect on Transmission Loss

| Experiment | Distance between anode and cathode mm | Distance between pipe to anode mm | Nodulization NaMoO$_4$ ppm | Nodulization SnSO$_4$ ppm | Nodulization Saccharin ppm | Vm μm$^3$/μm$^2$ | 8 GHz transmission loss A = Good B = Moderate C = Poor |
|---|---|---|---|---|---|---|---|
| 13 | 10 | 25 | 400 | 3000 | 10 | 0.11 | A |
| 14 | 10 | 25 | 200 | 5000 | 10 | 0.15 | B |
| 15 | 10 | 25 | 50 | 3000 | 10 | 2.27 | C |
| 16 | 10 | 25 | 200 | 1000 | 10 | 2.03 | C |
| 17 | 6 | 45 | 50 | 1000 | 10 | 2.55 | C |

Table 2 illustrates the reliability of copper foils for the experiments 1-17. For experiments 1-10, 15 and 16 the reliability is good (A) or moderate (B) as previously defined. For these examples, the hydrogen content is usually low (equal to or less than about 29 ppm), oxygen content is usually low (equal to or less than 468 ppm) and the tensile strength is usually high (greater than 21.3 kg/mm$^2$). By comparison, in experiment 11, where the reliability it poor (C), the hydrogen content is high (40 ppm), the oxygen content is high (469 ppm) and the tensile strength is low (14.2 kg/mm$^2$). Similarly, for experiment 17, the reliability is also poor (C) and the hydrogen content is high (55 ppm), the oxygen content is high (580 ppm) and the tensile strength is low (18.6 kg/mm$^2$). In example 12, the hydrogen content (16 ppm) and tensile strength (32.4 kg/mm$^2$) might be considered in a range that could lead to good reliability, but the oxygen content is very high at 524 ppm and the reliability is poor (C).

Experiments 13 and 14 may appear to be outliers, where the hydrogen and oxygen contents are low and tensile strength is high but the reliability is poor. For these two experiments, the property of Vm can be considered, where these are the lowest values in this data set. Where very low Vm correlates with good transmission loss performance, other properties, such as the reliability may become important at very low Vm and a lower limit of Vm can be considered depending on the application.

TABLE 2

Hydrogen, Oxygen and Tensile Strength Effect on Reliability

| Experiment | hydrogen Content ppm | oxygen Content ppm | Tensile strength after heat treatment kg/mm$^2$ | Reliability A = Good B = Moderate C = Poor |
|---|---|---|---|---|
| 1 | 15 | 149 | 36.0 | B |
| 2 | 29 | 256 | 21.3 | B |
| 3 | 5 | 53 | 45.1 | A |
| 4 | 15 | 86 | 40.7 | B |
| 5 | 17 | 348 | 29.3 | B |
| 6 | 16 | 147 | 34.1 | A |
| 7 | 11 | 135 | 36.7 | B |
| 8 | 16 | 143 | 35.0 | A |
| 9 | 15 | 136 | 34.4 | B |
| 10 | 23 | 362 | 21.6 | A |
| 11 | 40 | 469 | 14.2 | C |
| 12 | 16 | 524 | 32.4 | C |
| 13 | 14 | 122 | 31.2 | C |
| 14 | 13 | 132 | 36.8 | C |
| 15 | 19 | 134 | 37.3 | B |
| 16 | 12 | 148 | 34.1 | B |
| 17 | 55 | 580 | 18.6 | C |

As used herein the term "comprising" or "comprises" is used in reference to compositions, methods, and respective component(s) thereof, that are essential to the claimed invention, yet open to the inclusion of unspecified elements, whether essential or not.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about". The term "about" when may mean ±5% (e.g., ±4%, ±3%, ±2%, ±1%) of the value being referred to.

Where a range of values is provided, each numerical value between and including the upper and lower limits of the range is contemplated as disclosed herein. It should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. A surface-treated copper foil comprising:
an electrodeposited copper foil including a drum side and a deposited side, and
a treatment layer disposed on the drum side providing a surface-treated side,
wherein the treatment layer comprises a nodule layer and wherein the surface-treated side exhibits a material volume (Vm) in the range of 0.10 to less than 1.90 $\mu m^3/\mu m^2$.

2. The surface-treated copper foil of claim 1, wherein the surface-treated side exhibits a material volume (Vm) in a range of 0.11 to 1.86 $\mu m^3/\mu m^2$.

3. The surface-treated copper foil of claim 2, wherein the surface-treated side exhibits a material volume (Vm) in a range of 0.25 to 0.85 $\mu m^3/\mu m^2$.

4. The surface-treated copper foil of claim 1, wherein the surface-treated copper foil has an oxygen content equal to or less than 468 ppm.

5. The surface-treated copper foil of claim 4, wherein the surface-treated copper foil has an oxygen content equal to or less than 348 ppm.

6. The surface-treated copper foil of claim 5, wherein the surface-treated copper foil has an oxygen content in a range of 53 to 348 ppm.

7. The surface-treated copper foil of claim 1, wherein the surface-treated side exhibits a material volume (Vm) in a range of 0.25 to less than 1.90 $\mu m^3/\mu m^2$ and the surface-treated copper foil has an oxygen content equal to or less than 468 ppm.

8. The surface-treated copper foil of claim 1, wherein the surface-treated copper foil has a hydrogen content equal to or less than 29 ppm.

9. The surface-treated copper foil of claim 8, wherein the surface-treated copper foil has a hydrogen content in a range of 5 to 29 ppm.

10. The surface-treated copper foil of claim 1, wherein after the surface-treated copper foil is subjected to heating at 200° C. for 1 hour, the surface-treated copper foil exhibits a tensile strength in a range of 21.3 to 45.1 $kg/mm^2$.

11. The surface-treated copper foil of claim 4, wherein after the surface-treated copper foil is subjected to heating at 200° C. for 1 hour, the surface-treated copper foil exhibits a tensile strength in a range of 21.3 to 45.1 $kg/mm^2$.

12. The surface-treated copper foil of claim 1, wherein the treatment layer further comprises at least one of a cover layer, a barrier layer, an anti-tarnish layer, and a coupling layer.

13. The surface-treated copper foil of claim 12, wherein the cover layer comprises copper.

14. The surface-treated copper foil of claim 12, wherein the barrier layer comprises a metal or an alloy containing at least one of metal, and the metal is selected from Ni, Zn, Cr, Co, Mo, Fe, Sn, and V.

15. The surface-treated copper foil of claim 14, wherein the barrier layer comprises two or more layers, each layer independently comprising a metal or an alloy containing at least one of metal, and the metal is selected from Ni, Zn, Cr, Co, Mo, Fe, Sn, and V.

16. The surface-treated copper foil of claim 12, wherein the anti-tarnish layer comprises chromium.

17. The surface-treated copper foil of claim 12, wherein the coupling layer includes silicon.

18. The surface-treated copper foil of claim 1, wherein the nodule layer comprises copper nodules.

19. A laminate comprising,
a surface-treated copper foil and a resin layer in contact with a surface-treated side of the surface-treated copper foil,
the surface-treated copper foil comprising
an electrodeposited copper foil including a drum side and a deposited side,
a treatment layer disposed on the drum side providing the surface-treated side, and
wherein the treatment layer comprises a nodule layer,
wherein the surface-treated side exhibits a material volume (Vm) in a range of 0.11 to 1.86 $\mu m^3/\mu m^2$,
wherein the surface-treated copper foil has an oxygen content equal to or less than 468 ppm, a hydrogen content equal to or less than 29 ppm, and
wherein after the surface-treated copper foil is subjected to heating at 200° C. for 1 hour, the surface-treated copper foil exhibits a tensile strength in a range of 21.3 to 45.1 $kg/mm^2$.

20. A device comprising,
a circuit board comprising the surface-treated copper foil of claim 1 and a plurality of components mounted on the circuit board,
wherein at least a first component and a second component of the plurality of components are electrically connected to each other through the surface-treated copper foil of the circuit board.

* * * * *